United States Patent
Kang et al.

(10) Patent No.: US 8,332,169 B2
(45) Date of Patent: *Dec. 11, 2012

(54) APPARATUS AND METHOD FOR ESTIMATING STATE OF HEALTH OF BATTERY BASED ON BATTERY VOLTAGE VARIATION PATTERN

(75) Inventors: Jung-Soo Kang, Daejeon (KR); Jee-Ho Kim, Daejeon (KR); Ju-Young Kim, Daejeon (KR); Chang-Gi Jung, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/269,406

(22) Filed: Oct. 7, 2011

(65) Prior Publication Data

US 2012/0035873 A1 Feb. 9, 2012

Related U.S. Application Data

(63) Continuation of application No. 12/423,922, filed on Apr. 15, 2009, now Pat. No. 8,046,181.

(30) Foreign Application Priority Data

Aug. 8, 2008 (KR) .......................... 10-2008-0078180

(51) Int. Cl.
*G01R 31/36* (2006.01)
(52) U.S. Cl. .............. 702/63; 702/57; 702/60; 702/199; 320/127; 320/130; 320/131; 320/132; 320/156
(58) Field of Classification Search ............. 702/57, 702/60, 63, 199; 320/127, 130, 131, 132, 320/148, 149, 156
See application file for complete search history.

(56) References Cited

U.S. PATENT DOCUMENTS

| | | | |
|---|---|---|---|
| 6,011,379 A | 1/2000 | Singh et al. | |
| 6,534,954 B1 | 3/2003 | Plett | |
| 7,199,557 B2 | 4/2007 | Anbuky et al. | |
| 8,046,181 B2 * | 10/2011 | Kang et al. | 702/63 |
| 2006/0028172 A1 | 2/2006 | Vaillancourt et al. | |
| 2009/0128097 A1 | 5/2009 | Esnard | |

FOREIGN PATENT DOCUMENTS

| | | |
|---|---|---|
| JP | 2003-9408 A | 1/2003 |
| JP | 2006-98135 A | 4/2006 |
| KR | 10-2006-0052227 A | 5/2006 |
| KR | 10-0911317 B1 | 8/2009 |

* cited by examiner

*Primary Examiner* — Sujoy Kundu
(74) *Attorney, Agent, or Firm* — Birch, Stewart, Kolasch & Birch, LLP

(57) ABSTRACT

An apparatus estimates SOH of a battery based on a battery voltage variation pattern. A data storing unit obtains and stores battery voltage, current and temperature data from sensors, at each SOH estimation. A first SOC estimating unit estimates first SOC by current integration using the battery current data. A second SOC estimating unit estimates open-circuit voltage from the voltage variation pattern, and calculates and stores second SOC corresponding to the open-circuit voltage and temperature using correlations between the open-circuit voltage/temperature and SOC. A weighted mean convergence calculating unit calculates and stores convergence value for weighted mean value of ratio of the second SOC variation to the first SOC variation. A SOH estimating unit estimates capacity corresponding to the weighted mean convergence value using correlation between the weighted mean convergence value and the capacity, estimates relative ratio of the estimated capacity to an initial capacity, and stores it as SOH.

15 Claims, 7 Drawing Sheets

FIG. 10

| NO | ACTUAL CAPACITY (Ah) | PERCENTAGE TO INITIAL CAPACITY(%) | WEIGHTED MEAN CONVERGENCE VALUE | PERCENTAGE OF ESTIMATED CAPACITY(%) | ERROR OF ESTIMATED CAPACITY(%) |
|---|---|---|---|---|---|
| 1 | 4.9205 | 86.56755806 | 0.7288 | 83.808 | -2.760 |
| 2 | 4.9114 | 86.40745954 | 0.5318 | 82.1678 | -4.240 |
| 3 | 4.931 | 86.75228712 | 0.52185 | 83.014 | -3.738 |
| 4 | 5.667 | 99.70091485 | 0.3836 | 99.3136 | -0.387 |
| 5 | 5.6841 | 100.0017593 | 0.38338 | 99.3489 | -0.653 |
| 6 | 5.684 | 100 | 0.38376 | 99.288 | -0.712 |
| 7 | 5.4537 | 95.94827586 | 0.4027 | 96.3955 | 0.447 |
| 8 | 5.4601 | 96.06087262 | 0.4048 | 96.0914 | 0.031 |
| 9 | 5.4643 | 96.13476425 | 0.4069 | 95.7905 | -0.344 |
| 10 | 4.655 | 81.89655172 | 0.49664 | 85.3097 | 3.413 |
| 11 | 4.7226 | 83.08585503 | 0.49066 | 85.8889 | 2.803 |
| 12 | 4.6457 | 81.73293455 | 0.4987 | 85.1134 | 3.380 |

APPARATUS AND METHOD FOR ESTIMATING STATE OF HEALTH OF BATTERY BASED ON BATTERY VOLTAGE VARIATION PATTERN

This application is a Continuation of application Ser. No. 12/423,922 filed on Apr. 15, 2009, which is now U.S. Pat. No. 8,046,181, and which claims priority to Application No. 10-2008-0078180 filed in Korea, on Aug. 8, 2008. The entire contents of all of the above applications are hereby incorporated by reference.

BACKGROUND OF THE INVENTION

1. Field of the Invention

The present invention relates to apparatus and method for estimating SOH (State Of Health) of a battery, which is a parameter representing capacity degradation of a battery, and more particularly to apparatus and method for estimating SOH of a battery based on SOC (State Of Charge) that is a parameter representing a residual capacity of a battery.

2. Description of the Related Art

Generally, electric vehicles or hybrid electric vehicles (hereinafter, referred to as electric-driven vehicles) are driven in an electric-driven mode using an electric energy stored in a battery.

A vehicle using a fossil fuel operates an engine using a liquid fuel, so it is not difficult to measure a residual amount of fuel. However, in case of an electric-driven vehicle, it is not easy to accurately measure a residual energy of a battery.

An electric-driven vehicle is moved using an energy charged in a battery, so it is important to check a residual capacity of a battery. Accordingly, techniques for informing a driver of information such as a possible traveling distance by checking SOC of a battery are actively developed.

As an example, there is a method for measuring a voltage of a battery while the battery is charged/discharged, estimating an open-circuit voltage of the battery in an unloading state from the measured voltage, and then mapping SOC corresponding to the estimated open-circuit voltage by referring to a SOC table defining a SOC for each open-circuit voltage. However, when a battery is charged/discharged, the estimated voltage of a battery is significantly different from an actual voltage due to an IR drop effect, so accurate SOC cannot be obtained unless such an error is corrected.

For reference, the IR drop effect means a phenomenon that a voltage is rapidly changed when a battery starts being discharged in connected to a load or starts being charged from an external power source. Namely, a battery voltage rapidly decreases when discharge is initiated, and a voltage rapidly increases when charging is initiated.

As another example, there is a method for estimating SOC of a battery by integrating charging/discharging currents of the battery. When this method is used, SOC accuracy is deteriorated as time goes since measurement errors occurring during the current measuring process are continuously accumulated.

Meanwhile, SOH is another parameter representing a state of a battery, besides the above SOC. SOH is a parameter quantitatively representing a capacity change of a battery caused by an aging effect, and it allows checking how much the capacity of a battery is degraded. Thus, if SOH is checked, a battery may be exchanged at a suitable point of time, and also a charging/discharging capacity of a battery may be controlled according to a use term of the battery to prevent overcharging or overdischarging of the battery.

The change of capacity characteristics of a battery is reflected on the change of internal resistance of the battery, so it is known that SOH can be estimated from internal resistance and temperature of a battery. In other words, capacity of a battery is measured for each internal resistance and temperature of a battery through charging/discharging experiments. Then, the measured capacities are evaluated into relative numerical values based on an initial capacity of the battery to obtain a look-up table for SOH mapping. After that, internal resistance and temperature of a battery under an actual battery use circumstance are measured, and then SOH corresponding to the internal resistance and temperature is mapped from the look-up table to estimate SOH of a battery.

In the above SOH estimating method, the most important thing is how accurately an internal resistance of a battery can be obtained. However, it is in actually impossible to directly measure an internal resistance of a battery while the battery is charged/discharged. Thus, commonly, battery voltage and charging/discharging current are measured to indirectly calculate a battery internal resistance according to Ohm's law. However, since the battery voltage is different from an actual voltage due to the IR drop effect and also the battery current has a measurement error, the internal resistance simply calculated according to the Ohm's law and SOH estimated from the internal resistance does not ensure sufficient reliability.

SUMMARY OF THE INVENTION

The present invention is designed to solve the problems of the prior art, and therefore it is an object of the present invention to provide apparatus and method for estimating SOH with high accuracy.

Another object of the present invention is to provide apparatus and method for estimating SOH, which may improve accuracy of SOH estimation by using SOC estimated from a battery voltage variation pattern when SOH is estimated by a mathematical model.

Still another object of the present invention is to provide apparatus and method for estimating SOH, which may improve accuracy of SOH estimation by considering SOCs estimated in different ways together when SOH is estimated by a mathematical model.

In order to accomplish the above object, the present invention provides an apparatus for estimating SOH (State Of Health) of a battery based on a battery voltage variation pattern, which includes a data storing unit for obtaining and storing battery voltage, current and temperature data from a voltage sensing unit, a current sensing unit and a temperature sensing unit, which are coupled to a battery, whenever SOH is estimated; a first SOC (State Of Charge) estimating unit for estimating a first SOC by an Ampere counting manner using the stored battery current data; a second SOC estimating unit for estimating an open-circuit voltage from the stored battery voltage variation pattern, and calculating and storing a second SOC corresponding to the estimated open-circuit voltage and the battery temperature using correlations between the open-circuit voltage and SOC and between the battery temperature and SOC; a weighted mean convergence calculating unit for calculating and storing a convergence value for a weighted mean value of a ratio (or, a SOC variation ratio) of a variation of the second SOC to a variation of the first SOC; and a SOH estimating unit for estimating a battery capacity corresponding to the stored weighted mean convergence value of the SOC variation ratio by using a correlation between the weighted mean convergence value of the SOC variation ratio and the battery capacity, estimating a relative ratio of the estimated battery capacity to an initial battery capacity, and storing the relative ratio as SOH.

In one aspect of the present invention, the correlation between the weighted mean convergence value of the SOC variation ratio and the battery capacity is a look-up table in which battery capacities are defined for each weighted mean convergence value of SOC variation ratio. In this case, the SOH estimating unit estimates a battery capacity corresponding to the stored weighted mean convergence value of the SOC variation ratio by mapping from the look-up table.

In another aspect of the present invention, the correlation between the weighted mean convergence value of the SOC variation ratio and the battery capacity is a function using the weighted mean convergence value of the SOC variation ratio and the battery capacity as an input parameter and an output parameter, respectively. In this case, the SOH estimating unit estimates a battery capacity by substituting the stored weighted mean convergence value of the SOC variation ratio as the input parameter of the function.

Selectively, the SOH estimating unit calculates a relative ratio based on an allowable minimal battery capacity when a relative ratio of a current battery capacity to an initial battery capacity is calculated.

Preferably, the second SOC estimating unit includes an open-circuit voltage variation calculating unit for calculating an open-circuit voltage variation from a variation pattern of the stored battery voltages measured at present and in the past by applying a mathematical model defining the correlation between the battery voltage variation pattern and the open-circuit voltage variation, and estimating an open-circuit voltage variation at a present stage by reflecting a correction factor corresponding to the battery temperature on the calculated open-circuit voltage variation; an open-circuit voltage calculating unit for estimating a battery open-circuit voltage at a present stage by reflecting the estimated open-circuit voltage variation on a battery open-circuit voltage estimated at a last stage; and a SOC estimating unit for estimating and storing SOC corresponding to the estimated open-circuit voltage and the measured temperature by using the correlations between the open-circuit voltage and SOC and between the temperature and SOC.

Preferably, the open-circuit voltage calculating unit corrects an open-circuit voltage by adding a difference between a weight mean value (a greater weight is endowed as battery voltage is measured earlier) for present and previous battery voltages and an open-circuit voltage at a last stage to the estimated open-circuit voltage at a present stage. At this time, the previous battery voltage may be a battery voltage measured at a last stage.

Preferably, the estimated open-circuit voltage variation is calculated by multiplying the calculated open-circuit voltage variation by the correction factor according to the temperature.

Preferably, the battery voltages configuring the variation pattern include at least voltages $V_n$, $V_{n-1}$ and $V_{n-2}$ measured at a present stage, at a last stage and at the stage before last.

In the present invention, the mathematical model is defined by a mathematical operation between a battery voltage variation between a present stage and a previous stage and a pattern function defined by each voltage of the battery voltage variation pattern.

In the present invention, the correction factor is calculated by substituting a battery temperature as an input parameter of a mathematical model using the battery temperature (T) as an input parameter and the correction factor of the battery open-circuit voltage variation as an output parameter.

In order to accomplish the above object, the present invention also provides a method for estimating SOH of a battery based on a battery voltage variation pattern, which includes (a) obtaining and storing battery voltage, current and temperature data from a voltage sensing unit, a current sensing unit and a temperature sensing unit, which are coupled to a battery, whenever SOH is estimated; (b) estimating a first SOC by an Ampere counting manner using the stored battery current data; (c) estimating an open-circuit voltage from the stored battery voltage variation pattern, and calculating and storing a second SOC corresponding to the estimated open-circuit voltage and the battery temperature using correlations between the open-circuit voltage and SOC and between the battery temperature and SOC; (d) calculating and storing a convergence value for a weighted mean value of a ratio (or, a SOC variation ratio) of a variation of the second SOC to a variation of the first SOC; and (e) estimating a battery capacity corresponding to the stored weighted mean convergence value of the SOC variation ratio by using a correlation between the weighted mean convergence value of the SOC variation ratio and the battery capacity, estimating a relative ratio of the estimated battery capacity to an initial battery capacity, and storing the relative ratio as SOH.

BRIEF DESCRIPTION OF THE DRAWINGS

Other objects and aspects of the present invention will become apparent from the following description of embodiments with reference to the accompanying drawing in which:

FIG. 10 is a table showing actual capacity of each battery, a percentage of present capacity to an initial capacity of each battery, a weighted mean convergence value of a SOC variation ratio, a percentage of an estimated capacity to an initial capacity of each battery, and an error of the estimated capacity based on an actual capacity, which are calculated during experiments.

DESCRIPTION OF THE PREFERRED EMBODIMENT

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Figure 1:
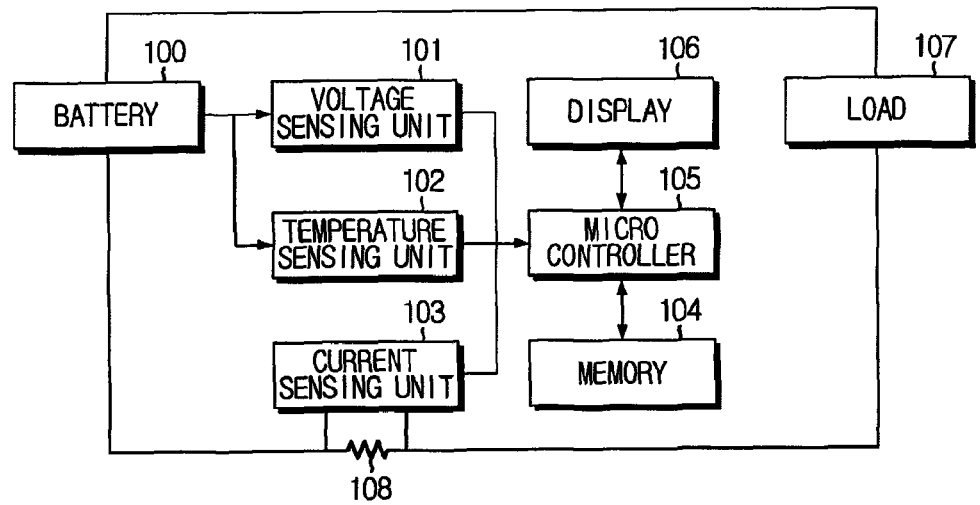
FIG. 1 is a schematic view showing an apparatus for estimating SOH of a battery based on a battery voltage variation pattern according to an embodiment of the present invention.

FIG. 1 is a schematic view showing an apparatus for estimating SOH (State Of Health) of a battery based on a battery voltage variation pattern according to an embodiment of the present invention.

Referring to FIG. 1, the apparatus for estimating SOH of a battery based on a battery voltage variation pattern according to the present invention is connected between a battery 100 and a load 107, and includes a voltage sensing unit 101, a temperature sensing unit 102, a current sensing unit 103, a memory 104 and a microcontroller 105.

The voltage sensing unit 101 measures a battery voltage under the control of the microcontroller 105 at each SOH estimation and outputs the battery voltage to the microcontroller 105.

The temperature sensing unit 102 measures a battery temperature under the control of the microcontroller 105 at each SOH estimation and outputs the battery temperature to the microcontroller 105.

The current sensing unit 103 measures a battery current flowing through a current sensing resistance 108 under the control of the microcontroller 105 at each SOH estimation and outputs the battery current to the microcontroller 105.

The memory 104 stores programs required for estimating capacity degradation of a battery, various data required for estimating battery capacity degradation in advance, battery voltage, temperature and current data measured by the voltage sensing unit 101, the temperature sensing unit 102 and the current sensing unit 103, and various calculation values occurring at various calculation processes for estimating battery capacity degradation.

The microcontroller 105 receives battery voltage, temperature and current data from the voltage sensing unit 101, the temperature sensing unit 102 and the current sensing unit 103 at each estimation of SOH of the battery 100 and stores the data in the memory 104. Also, the microcontroller 105 reads and executes a battery capacity degradation estimating program from the memory 104, estimates SOH of a battery and stores the SOH in the memory 104, and outputs the estimated SOH outwards through a display 106 as necessary. Configuration and operations of the battery capacity degradation estimating program will be explained later in detail.

The kind of the battery 100 is not specially limited, and it may adopt lithium ion batteries, lithium polymer batteries, nickel cadmium batteries, nickel hydrogen batteries, nickel zinc batteries and so on, which are rechargeable and whose charging state should be considered.

The kind of the load 107 is not specially limited, and it may be portable electronic devices such as video cameras, mobile phones, portable PC, PMP and MP3 players, motors of electric vehicles or hybrid vehicles, DC to DC converters, and so on.

Figure 2:
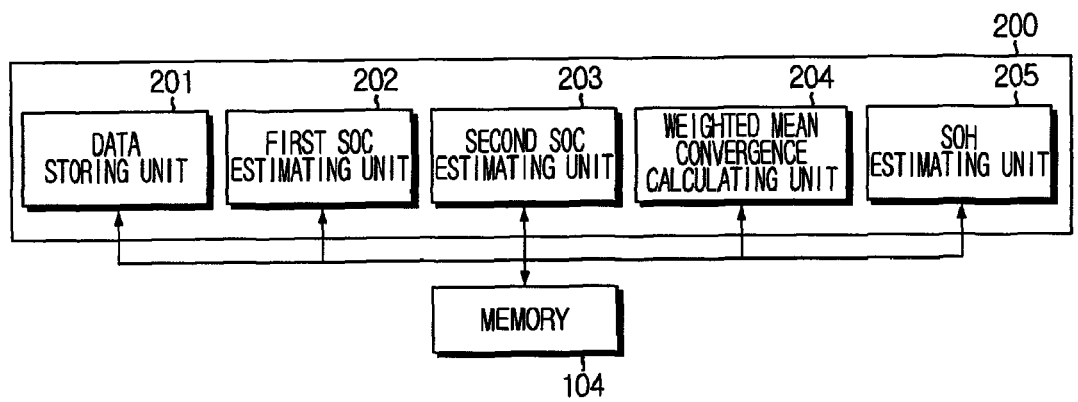
FIG. 2 is a block diagram showing a battery SOH estimating program according to an embodiment of the present invention.

FIG. 2 is a block diagram showing a battery SOH estimating program according to an embodiment of the present invention.

Referring to FIG. 2, the battery capacity degradation estimating program 200 according to the present invention is executed by the microcontroller 105 and includes a data storing unit 201, a first SOC estimating unit 202, a second SOC estimating unit 203, a weighted mean convergence calculating unit 204 and a SOH estimating unit 205.

The data storing unit 201 receives battery voltage, temperature and current data from the voltage sensing unit 101, the temperature sensing unit 102 and the current sensing unit 103, shown in FIG. 1, at each SOH estimation and stores the data in the memory 104.

The first SOC estimating unit 202 estimates $SOC_I^n$ at each SOH estimation by an Ampere counting manner using battery current data accumulatively stored in the memory 104 and stores the estimated $SOC_I^n$ in the memory 104. Here, n represents that the estimated SOH is $n^{th}$ SOH, which is identically applied in the below.

For reference, the Ampere counting manner is a method for accumulating charging/discharging current of a battery based on an initial battery capacity to obtain a currently remaining capacity of the battery, and calculating a relative ratio of a present capacity based on the initial capacity to estimate SOC. The Ampere counting manner is well known in the art, so it is not described in detail here.

The second SOC estimating unit 203 calculates an open-circuit voltage at each SOH estimation using a battery voltage variation pattern stored in the memory 104, estimates $SOC_{II}^n$ corresponding to the calculated open-circuit voltage, and stores the estimated $SOC_{II}^n$ in the memory.

In more detail, the second SOC estimating unit 203 calculates an open-circuit voltage variation $\Delta OCV^n$ of a battery using a battery voltage variation pattern, corrects the calculated battery open-circuit voltage variation by applying a correction factor according to temperature thereto, calculates a battery open-circuit voltage $OCV^n$ at a present stage by reflecting the corrected battery open-circuit voltage variation on a previously calculated open-circuit voltage $OCV^{n-1}$, and estimates $SOC_{II}^n$ corresponding to the calculated battery open-circuit voltage and the measured battery temperature by using predefined correlations between a battery open-circuit voltage and SOC and between temperature and SOC. Also, the second SOC estimating unit 203 stores the estimated $SOC_{II}^n$ in the memory 104.

The weighted mean convergence calculating unit 204 calculates a variation of SOC estimated based on an Ampere counting manner and a variation of SOC estimated using the battery voltage variation pattern according to the following Math FIGS. 1 and 2.

$$\Delta SOC_I^n = SOC_I^n - SOC_I^{n-1} \qquad \text{Math Figure 1}$$

where, $\Delta SOC_I^n$: variation of $n^{th}$ SOC, estimated by an Ampere counting manner, $SOC_I^n$: SOC calculated at a present SOC estimation, $SOC_I^{n-1}$: SOC calculated at a last SOC estimation.

$$\Delta SOC_{II}^n = SOC_{II}^n - SOC_{II}^{n-1} \qquad \text{Math Figure 2}$$

where, $\Delta SOC_{II}^n$: variation of $n^{th}$ SOC, estimated by a battery voltage variation pattern, $SOC_{II}^n$: SOC calculated at a present SOC estimation, $SOC_{II}^{n-1}$: SOC calculated at a last SOC estimation.

Figure 3:
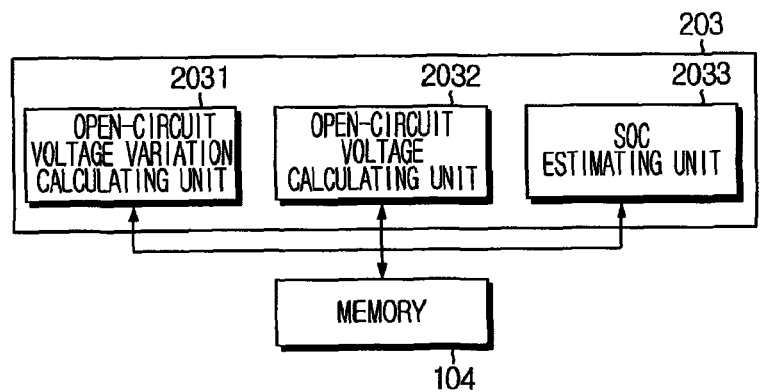
FIG. 3 is a block diagram showing a second SOC estimating unit for estimating SOC based on a battery voltage variation pattern according to the present invention.

Subsequently, the weighted mean convergence calculating unit 204 calculates an absolute ratio $Ratio\_SOC^n$ of $\Delta SOC_{II}^n$ relative to $\Delta SOC_I^n$ using the following Math FIG. 3. Hereinafter, the absolute ratio is called a SOC variation ratio.

$$Ratio\_SOC^n = |\Delta SOC_{II}^n|/|\Delta SOC_I^n| \qquad \text{Math Figure 3}$$

Figure 4:
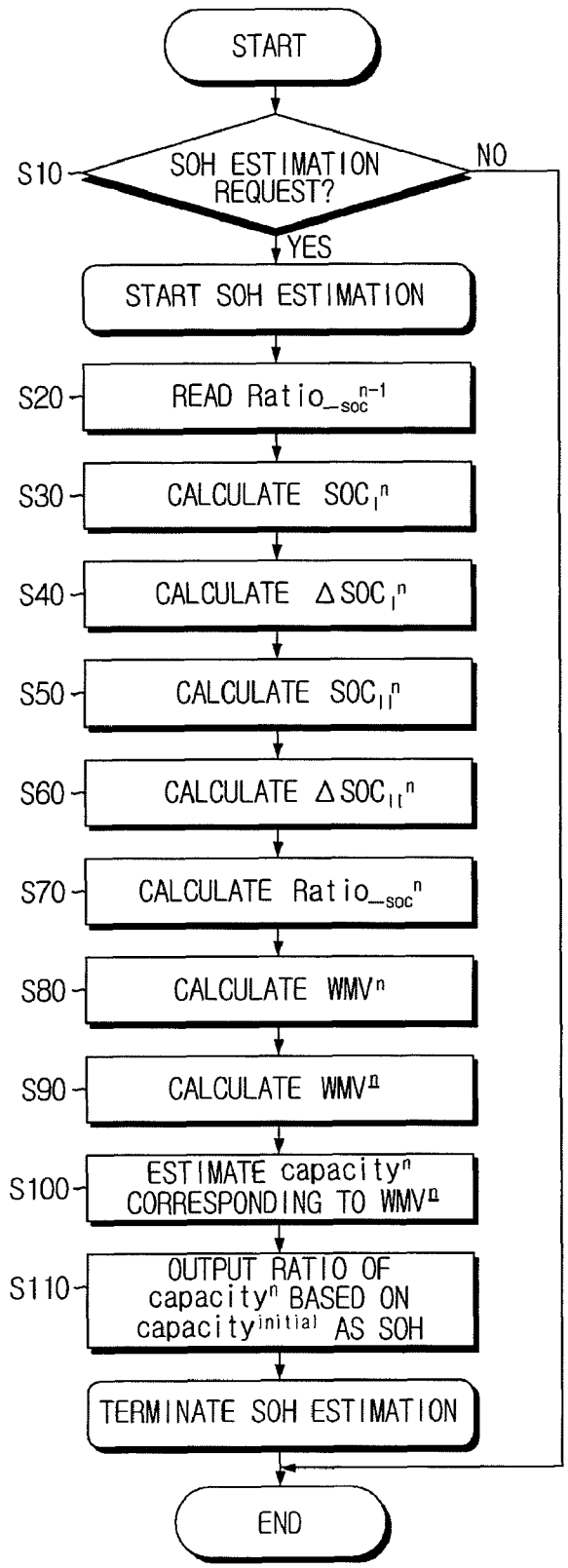
FIG. 4 is a flowchart illustrating a method for estimating SOH based on a battery voltage variation pattern according to an embodiment of the present invention.

Then, the weighted mean convergence calculating unit 204 calculates a weighted mean value for the SOC variation ratio $Ratio\_SOC^n$ using the following Math Figure 4.

$$WMV^n = (Ratio\_SOC^{n-1} \times weight + Ratio\_SOC^n)/(weight+1) \qquad \text{Math Figure 4}$$

The weighted mean value $WMV^n$ is converged to a certain value as n is increased, as explained below in detail.

Figure 6:
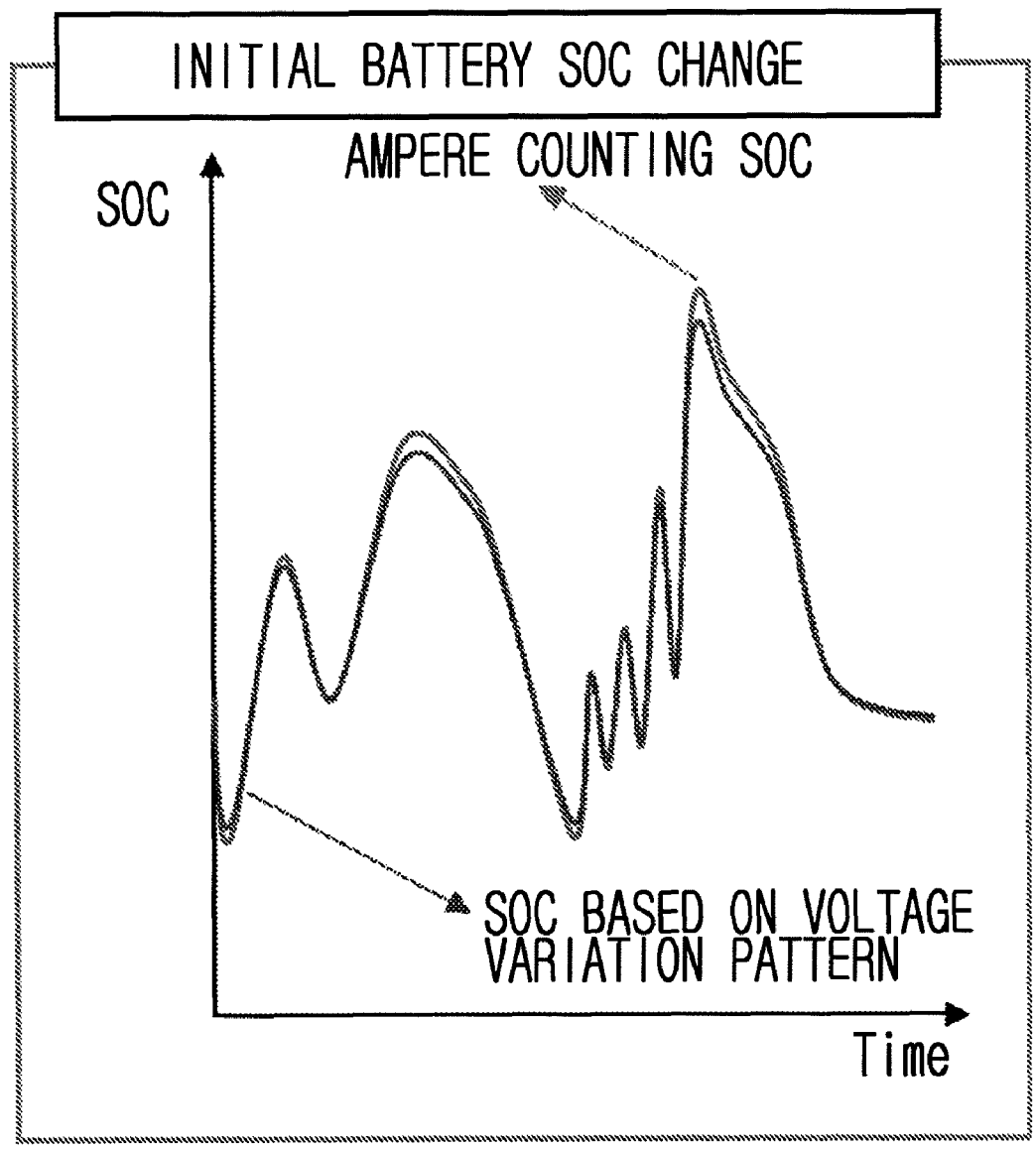
FIG. 6 is a graph showing variation patterns of SOC estimated by an Ampere counting manner and SOC estimated by a battery voltage variation pattern under the same charging/discharging condition at an initial battery usage stage.

FIG. 6 is a graph showing variation patterns of $SOC_I^n$ and $SOC_{II}^n$ estimated under the same charging/discharging condition at an initial battery usage stage. Referring to FIG. 6, it would be understood that, at an initial battery usage stage, SOC estimated by an Ampere counting manner is not greatly different from SOC estimated based on a battery voltage variation pattern.

Figure 7:
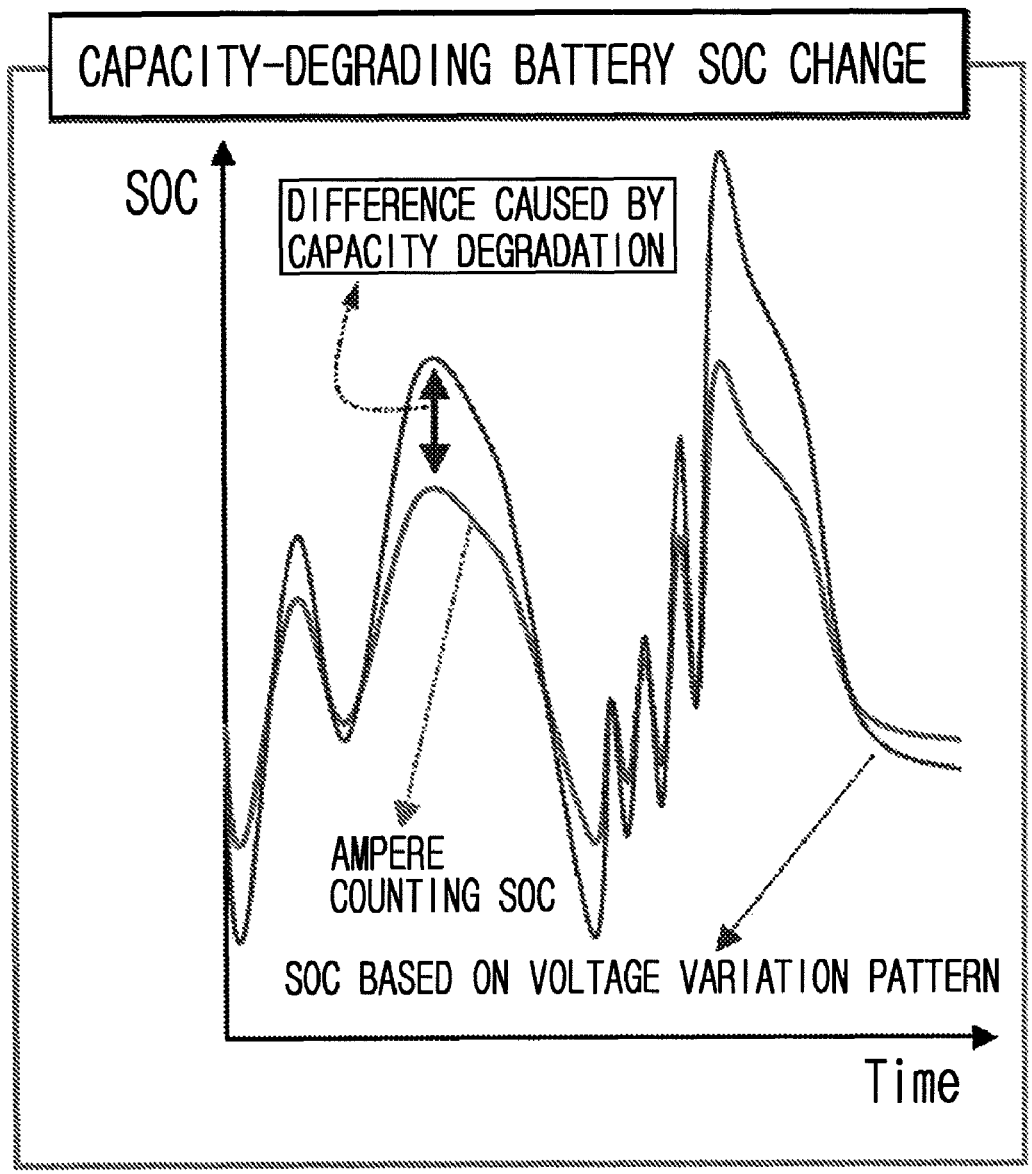
FIG. 7 is a graph showing variation patterns of SOC estimated by an Ampere counting manner and SOC estimated by a battery voltage variation pattern under the same charging/discharging condition after the capacity of a battery is degraded to some extent.

FIG. 7 is a graph showing variation patterns of $SOC_I^n$ and $SOC_{II}^n$ under the same charging/discharging condition after a battery is used for a certain time, namely after the capacity of a battery is degraded to some extent. Referring to FIG. 7, it would be understood that, after the capacity of a battery is degraded to some extent, a difference between SOC estimated by an Ampere counting manner and SOC estimated by a battery voltage variation pattern is increased.

As shown in FIGS. 6 and 7, in case a battery is charged/discharged in the same pattern, the SOC profile estimated by an Ampere counting manner is not dependent on battery capacity degradation and not changed seriously. It means that SOC estimated by an Ampere counting manner exhibits the same variation pattern regardless of battery capacity degradation if a charging/discharging pattern of a battery is kept constantly.

Meanwhile, SOC estimated based on a battery voltage variation pattern exhibits that a SOC profile is changed greatly in proportion to battery capacity degradation. In other words, as the capacity of a battery is degraded, a battery voltage is rapidly increased even with a small charging current and rapidly decreased even with a small discharging current. Thus, the SOC estimated based on a battery voltage variation pattern is greatly changed according to battery capacity degradation. From this fact, it would be understood that, if a battery capacity is degraded, a variation of SOC estimated based on an open-circuit voltage variation pattern is increased depending on the degree of battery capacity degradation though the battery is charged/discharged in the same pattern.

Figure 8:
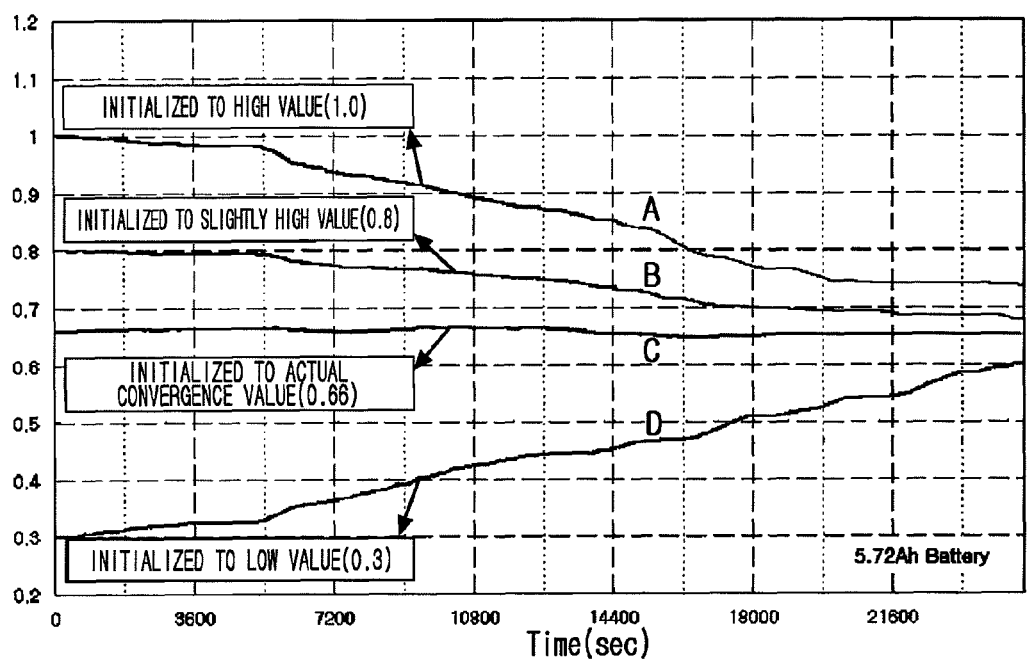
FIGS. 8 and 9 are graphs showing periodically calculated weighted mean values of SOC variation ratios by arbitrarily setting an initial weighted mean value into different values while charging/discharging tests are executed for two batteries whose capacities are already known.
Figure 9:
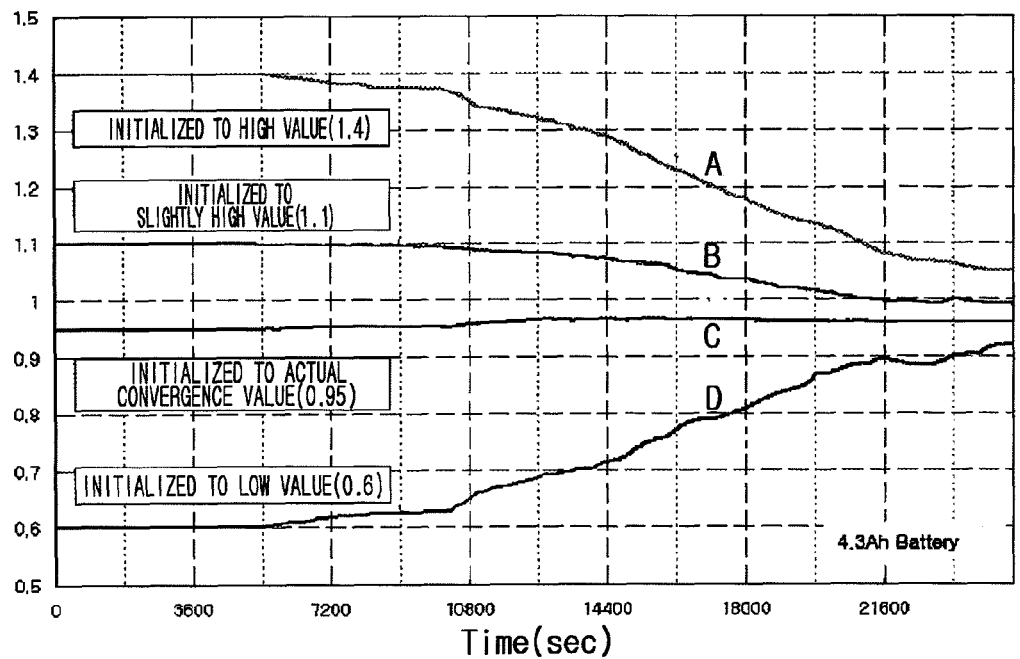

FIGS. 8 and 9 are graphs showing periodically calculated weighted mean values of SOC variation ratios by arbitrarily setting an initial weighted mean value $WMV^1$ into different values while charging/discharging tests are executed for two batteries whose capacities are already known.

In FIGS. 8, A, B, C and D are graphs of weighted mean values calculated in a state that an initial weighted mean value $WMV^1$ is set to 1.0, 0.8, 0.66 and 0.3, respectively, for a battery with a capacity of 5.72 Ah. Here, 0.66 is an actual weighted mean convergence value.

In FIGS. 9, A, B, C and D are graphs of weighted mean values calculated in a state that an initial weighted mean value $WMV^1$ is set to 1.4, 1.1, 0.95 and 0.6, respectively, for a battery with a capacity of 4.3 Ah. Here, 0.95 is an actual weighted mean convergence value.

Referring to FIGS. 8 and 9, it would be understood that the weighted mean value of SOC variation ratio is converged identically to an actual convergence value regardless of an initial weighted mean value, and the weighted mean convergence value is increased if capacity of a battery is decreased. Thus, it would be fully understood that the weighted mean convergence value may be a parameter quantitatively representing degradation of capacity of a battery.

Meanwhile, a weighted mean convergence value of SOC variation ratio may be obtained through charging/discharging experiments over a long time. However, under an actual use circumstance of a battery, when a weighted mean value of SOC variation ratio is obtained at a specific point of time, a mathematical modeling should be used for estimating a value to which the weighted mean value of SOC variation ratio will be converged in the future.

Figure 5:
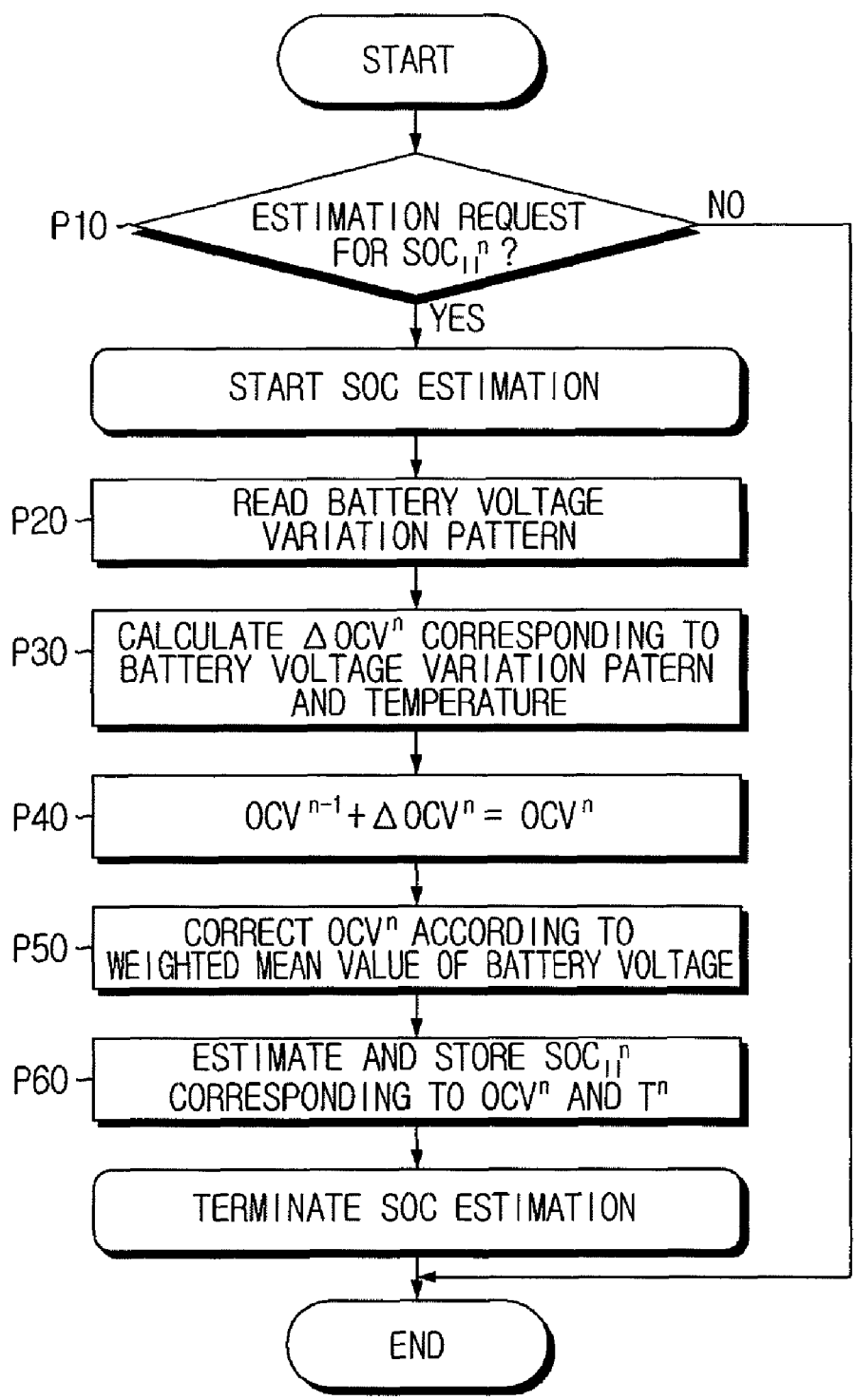
FIG. 5 is a flowchart illustrating a SOC estimating process based on a battery voltage variation pattern according to an embodiment of the present invention.

Accordingly, the weighted mean convergence calculating unit 204 obtains a weighted mean convergence value $WMV^{\underline{n}}$ by repeatedly calculating weighted mean values of SOC variation ratio as much as p, which is a sufficiently great number, by means of a weighted mean arithmetic progression having a weighted mean value of SOC variation ratio as an initial condition using the following Math Figure 5, and then stores the convergence value in the memory 104. Here, $WMV^{\underline{n}}$ represents a value to which the weighted mean value is converged.

Weighted Mean Arithmetic Progression $$WMV^n_{k+1} = (WMV^n_{k-1} \times weight + WMV^n_k)/(weight+1)$$

Initial Condition of Weighted Mean Arithmetic Progression $$WMV^n_1 = (Ratio\_SOC^{n-1} \times weight + Ratio\_SOC^n)/(weight+1) \qquad \text{Math Figure 5}$$

In the Math Figure 5, k is an integer not less than 1. When k=1, $WMV^n_0$ is set as $WMV^{\underline{n-1}}$ that is a weighted mean convergence value of SOC variation ratio obtained at a last stage. The number of calculation times of the weighted mean arithmetic progression is set to a great number over several thousands. An initial weighted mean convergence value $WMV^{\underline{1}}$ is previously set when a battery is produced, and stored in the memory 104 for reference.

The SOH estimating unit 205 reads a weighted mean convergence value of SOC variation ratio from the memory 104 and then estimates a battery capacity $Capacity^n$. In other words, the SOH estimating unit 205 calculates an estimated battery capacity $Capacity^n$ corresponding to the weighted mean convergence value of SOC variation ratio using a correlation between the battery capacity and the weighted mean convergence value of SOC variation ratio.

As one example, the correlation is a look-up table defining battery capacity for each weighted mean convergence value of SOC variation ratio. As another example, the correlation may be a function using a weighted mean convergence value of SOC variation ratio and battery capacity as an input parameter and an output parameter, respectively.

The correlation is obtained as follows. While charging/discharging experiments are conducted under the same conditions for a long time to a sufficiently large amount of batteries whose actual capacities are already known in a wide range, weighted mean convergence values of SOC variation ratio are obtained. After that, battery capacities corresponding to the weighted mean convergence values of SOC variation ratio obtained through the experiments are configured into a look-up table. In other case, a functional relation between weighted mean convergence values of SOC variation ratio and battery capacities is obtained through a numerical analysis using the weighted mean convergence values of SOC variation ratio, obtained as a result of the experiments, and the known battery capacities as input parameters and output parameters, respectively.

The SOH estimating unit 205 calculates a battery capacity Capacity$^n$ corresponding to the weighted mean convergence value of SOC variation ratio and then calculates a relative ratio of the calculated battery capacity Capacity$^n$ with respect to an initial battery capacity Capacity$^{initial}$ according to the following Math FIGS. 6 and 7. And then, the SOH estimating unit 205 estimates the calculated result as SOH$^n$ that is a parameter representing battery capacity degradation.

$$SOH^n = (Capacity^n \div Capacity^{initial}) \times 100 \qquad \text{Math Figure 6}$$

$$SOH^n = [(Capacity^n - Capacity^{limit}) \div (Capacity^{initial} - Capacity^{initial})] \times 100 \qquad \text{Math Figure 7}$$

In the Math FIGS. 6 and 7:
SOH$^n$: battery capacity degradation estimated at present,
Capacity$^n$: battery capacity estimated at present,
Capacity$^{initial}$: initial battery capacity, and
Capacity$^{limit}$: allowable minimal capacity for using a battery.

SOH$^n$ represents a present battery capacity as a relative ratio based on an initial battery capacity, so it becomes a parameter to determine how much battery life remains based on an initial battery capacity. Also, SOH$^n$ may be utilized to control a charging/discharging capacity of a battery. For example, if SOH$^n$ is decreased, a charging capacity and a discharging capacity of a battery may be decreased depending on the variation amount of SOH$^n$. In this case, it is possible to effectively prevent a battery from being overcharged or overdischarged by charging or discharging a battery suitably for its capacity.

The SOH estimating unit 205 may output the estimated SOH$^n$ to the display 106. In this case, the display 106 is coupled to the microcontroller 105 through an interface. Also, the SOH estimating unit 205 outputs SOH$^n$ to the display 106 through the interface. Then, the display 106 visually displays SOH$^n$ such that a user may recognize it.

FIG. 3 is a block diagram showing a second SOC estimating unit for estimating SOC based on a battery voltage variation pattern according to the present invention in more detail.

Referring to FIG. 3, the second SOC estimating unit 203 includes an open-circuit voltage variation calculating unit 2031, an open-circuit voltage calculating unit 2032, and a SOC estimating unit 2033.

The open-circuit voltage variation calculating unit 2031 calculates an open-circuit voltage variation based on an open-circuit voltage at a last stage using a battery voltage variation pattern in order to calculate a present battery open-circuit voltage. In other words, the open-circuit voltage variation calculating unit 2031 calculates how much a battery open-circuit voltage at a present stage is changed based on the open-circuit voltage at a last stage.

In detail, the open-circuit voltage variation calculating unit 2031 reads a battery voltage V$^n$ measured at a present SOC estimation, a battery voltage V$^{n-1}$ measured at a last SOC estimation and a battery temperature T$^n$ measured at a present SOC estimation from the memory 104. After that, the open-circuit voltage variation calculating unit 2031 calculates an open-circuit voltage variation ΔOCV$^n$ according to the following Math FIG. 8.

$$\Delta OCV^n = OCV^n - OCV^{n-1} = G(V) \times F(T) \qquad \text{Math Figure 8}$$

In the Math Figure 8, G(V) is an open-circuit voltage variation operation function for mapping a battery voltage variation 'V$^n$-V$^{n-1}$' into an open-circuit voltage variation ΔOCV$^n$, and F(T) is an open-circuit voltage correction function for correcting the open-circuit voltage variation ΔOCV$^n$ by reflecting an open-circuit voltage change according to temperature.

G(V) is a function not for converting a battery voltage variation into an open-circuit voltage variation as it is, but for converting it while correcting an error of battery voltage caused by IR drop (namely, a difference between a measured voltage and an actual voltage). In other words, if a battery voltage variation tends to increase, G(V) decreases the battery voltage variation and then outputs the decreased battery voltage variation as a battery open-circuit voltage variation. Also, a battery voltage variation tends to be kept as it was, G(V) outputs the battery voltage variation as a battery open-circuit voltage variation as it is. In addition, if a battery voltage variation tends to decrease, G(V) amplifies the battery voltage variation slightly and then outputs the slightly amplified battery voltage variation as a battery open-circuit voltage variation.

G(V) may be obtained by mathematically modeling a correlation between a battery voltage variation pattern and an open-circuit voltage variation corresponding thereto under a certain temperature condition. As one example, the mathematical modeling function may be obtained by analyzing a correlation existing between a variation pattern of battery voltages V$^n$, V$^{n-1}$ and V$^{n-2}$ and an open-circuit voltage variation ΔOCV$^n$ corresponding thereto under a laboratory condition allowing measurement of battery voltage and battery open-circuit voltage. The number of battery voltages configuring a variation pattern of battery voltages may be extended to four or more.

G(V) may be generalized as in the following Math Figure 9.

$$G(V) = (V^n - V^{n-1}) \times g(V^n, V^{n-1}, V^{n-2}, \ldots) \qquad \text{Math Figure 9}$$

Here, g(V$^n$, V$^{n-1}$, V$^{n-2}$, ...) is a pattern function defining a battery voltage variation pattern. The symbol '...' means that the pattern function may be defined using at least three battery voltages, including a battery voltage measured at a present stage. The pattern function is defined by analyzing a correlation between a plurality of battery voltage variations and battery open-circuit voltage variations, experimentally obtained. As an example, the function g may be defined as a ratio of a voltage variation at a last stage based on a voltage variation at a present stage. However, the present invention is not limited to any specific math figure of the pattern function g.

Meanwhile, a battery internal resistance changes depending on temperature. If an internal resistance of a battery is changed, a battery voltage variation pattern and a battery open-circuit voltage variation are changed even under the same charging or discharging condition. F(T) corrects the open-circuit voltage variation, calculated by G(V), according to a temperature condition. In other words, F(T) is a function for correcting an open-circuit voltage variation calculated by G(V) in case a battery temperature is different from a temperature set as a calculation condition of G(V). F(T) may be obtained by analyzing a variation correlation between a battery voltage variation pattern and a battery open-circuit voltage variation while changing temperature at regular intervals. In other words, in a state that experimental conditions are set such that a battery voltage variation pattern at each measurement temperature set as regular intervals, for example 1° C. intervals, is identical, F(T) may be obtained by measuring a changing amount of a battery open-circuit voltage variation $\Delta OCV^n$ based on $\Delta OCV^n$ obtained at a standard temperature and then applying a mathematical modeling for the temperature and the changing amount of $\Delta OCV^n$ by using the temperature T and the changing amount $\Delta OCV^n$ as an input parameter and an output parameter, respectively. The obtained F(T) becomes a function outputting a correction factor of a battery open-circuit voltage variation using the battery temperature T as an input parameter. For simplified calculation, it is possible to configure a look-up table with correction factors depending on each T value and then refer to a correction factor for each temperature, stored in the look-up table, for calculating a battery open-circuit voltage variation.

The open-circuit voltage calculating unit 2032 reads an open-circuit voltage $OCV^{n-1}$ measured at a last SOC estimation from the memory 104, and then adds the open-circuit voltage variation $\Delta OCV^n$ calculated by the open-circuit voltage variation calculating unit 2031 to $OCV^{n-1}$ to calculate an open-circuit voltage $OCV^n$ at a last SOC estimation.

Preferably, the open-circuit voltage calculating unit 2032 calculates a weighted mean value $V^n_{(meanvalue)}$ between a battery voltage $V_n$ and a battery voltage measured at a last stage through the following Math Figure 10.

$$V^n_{(meanvalue)} = (A_1 *V_1 + A_2 *V_2 + \ldots + A_{n-1} *V_{n-1} + A_n *V_n)/A_{total}$$

$$A_{total} = A_1 + A_2 + A_3 + \ldots + A_n \qquad \text{Math Figure 10}$$

In Math Figure 10, $A_k$ is decreased as k increases. For example, in case n=100, $A_k$ may have a value starting from 100 and decreased by 1. As an alternative example, in the Math Figure 10, $A_1 *V_1 + A_2 *V_2 + \ldots + A_{k-2} *V_{k-2}$ ($3 \leq k \leq n$) may be omitted. Even in this case, the changing tendency of $A_k$ is maintained as above. For example, in case k=n, it is possible that $A_1 *V_1 + A_2 *V_2 + \ldots + A_{n-2} *V_{n-2}$ is set as 0 and a larger value is endowed to $A_{n-1}$ rather than $A_n$. For example, 90 and 100 may be endowed to $A_{n-1}$ and $A_n$, respectively.

The open-circuit voltage calculating unit 2032 may correct the open-circuit voltage once again by adding a difference between the calculated weighted mean value $V^n_{(meanvalue)}$ and the open-circuit voltage $OCV^{n-1}$ estimated at a last SOC estimation to the calculated open-circuit voltage $OCV^n$ for additional correction. If the weighted mean value is calculated and used for correcting an open-circuit voltage additionally, a calculation error of the open-circuit voltage may be decreased though a voltage output from the battery 100 is rapidly changed.

The SOC estimating unit 2033 maps and outputs $SOC_{II}^n$ corresponding to the open-circuit voltage $OCV^n$ calculated by the open-circuit voltage calculating unit 2032 and the temperature $T^n$ measured at a present SOC estimation from the SOC look-up table defining SOC for each temperature and each open-circuit voltage, stored in the memory 104.

One example of the SOC look-up table for each temperature and each open-circuit voltage is shown in the following table 1.

TABLE 1

| SOC | ... | −30° C. | 0° C. | 30° C. | ... |
|---|---|---|---|---|---|
| 0% | ... | 2.7 V | 2.78 V | 2.77 V | ... |
| 1% | ... | 2.82 V | ... | ... | ... |
| 2% | ... | 2.97 V | ... | ... | ... |
| . | . | . | . | . | . |
| . | . | . | . | . | . |
| . | . | . | . | . | . |

The SOC estimating unit 2033 estimates $SOC_{II}^n$ by mapping an open-circuit voltage $OCV^n$ and a temperature $T^n$ from the look-up table where SOC for each temperature and each open-circuit voltage is recorded as shown in the Table 1. For example, If an open-circuit voltage is 2.97 and a battery temperature is −30° C., it could be found that $SOC_{II}^n$ is 2%. If $SOC_{II}^n$ is estimated in the above way, the SOC estimating unit 2033 stores the estimated $SOC_{II}^n$ in the memory 104.

Now, a method for estimating battery capacity degradation using a battery voltage variation pattern will be explained in detail based on the above.

FIG. 4 is a flowchart illustrating a method for estimating SOH based on a battery voltage variation pattern according to the present invention. In FIG. 4, each step is executed by the microcontroller 105 shown in FIG. 1.

In the step S10, it is determined whether there is a request for SOH estimation of a battery. The SOH estimation request may be input from the outside or automatically generated by a battery SOH estimating program.

If there is a battery SOH estimation request as a determination result of the S10, a routine for estimating battery capacity degradation is initiated. On the contrary, if there is no battery SOH estimation request, the process is terminated.

In the step S20, a SOC variation ratio $Ratio\_{SOC}^{n-1}$ obtained at a last SOH estimation and recorded in the memory is read.

Subsequently, in the step S30, $SOC_I^n$ is calculated by means of an Ampere counting manner, and in the step S40, a variation $\Delta SOC_I^n$ of SOC calculated by the Ampere counting manner is calculated.

Then, in the step S50, $SOC_{II}^n$ is calculated based on a battery voltage variation pattern, and in the step S60, a variation $\Delta SOC_{II}^n$ of SOC calculated by the battery voltage variation pattern is calculated.

After that, in the step S70, a SOC variation ratio $Ratio\_{SOC}^n$ is calculated. And then, in the step S80, a weighted mean value $WMV^n$ is obtained using $Ratio\_{SOC}^{n-1}$ and $Ratio\_{SOC}^n$, and in the step S90, a weighted mean convergence value $WMV^n_c$ is calculated and stored.

And then, in the step S100, a battery capacity $Capacity^n$ corresponding to the weighted mean convergence value of SOC variation ratio is estimated using the correlation between the weighted mean convergence value of SOC variation ratio and the battery capacity.

Finally, in the step S110, a relative ratio of the estimated battery capacity $Capacity^n$ is calculated based on an initial battery capacity $Capacity^{initial}$, and the calculated relative ratio is estimated as $SOH^n$, which is then stored or output to the outside.

If the above processes are completed, the procedure for estimating capacity degradation of a battery is entirely completed.

FIG. 5 is a flowchart illustrating a process for estimating $SOC_{II}^n$ based on a battery voltage variation pattern in the step S50 of FIG. 4. In FIG. 5, each step is executed by the microcontroller 105 shown in FIG. 1.

Referring to FIG. 5, first, in the step P10, it is determined whether there is a request for estimation of $SOC_{II}^n$. The request for estimation may be input from the outside or automatically generated according to a program algorithm.

If there is a request for estimation of $SOC_{II}^n$ in the step P10, a $SOC_{II}^n$ estimating step is executed. If there is no request for estimation of $SOC_{II}^n$, the process is terminated.

In the step P20, a battery voltage variation pattern stored in the memory is read. The battery voltage variation pattern includes at least $V^n$, $V^{n-1}$ and $V^{n-2}$. After that, in the step P30, an open-circuit voltage variation $\Delta OCV^n$ is calculated by means of the battery voltage variation pattern and a battery temperature. Here, the calculation method for an open-circuit voltage variation $\Delta OCV^n$ is already explained above.

Meanwhile, in the present invention, $V^1$ and $V^2$ as well as $OCV^1$ and $OCV^2$ are initialized into battery voltages in an unloaded state, measured right before a battery is connected to a load. For example, in case a battery is used for an electric-driven vehicle, $V^1$ and $V^2$ as well as $OCV^1$ and $OCV^2$ are set as battery voltages measured when the vehicle starts using a key.

Then, in the step P40, the open-circuit voltage variation $\Delta OCV^n$ is added to a last open-circuit voltage $OCV^{n-1}$ to calculate a present open-circuit voltage $OCV^n$. Subsequently, in the step P50 that may be selectively executed, a weighted mean value of a present battery voltage $V^n$ and a last battery voltage $V^{n-1}$ is calculated, and a difference between the calculated weighted mean value and the last open-circuit voltage $OCV^{n-1}$ is added to the present open-circuit voltage $OCV^n$ to additionally correct the open-circuit voltage $OCV^n$. The calculation method for weight mean value is already explained above.

Subsequently, in the step S60, $SOC_{II}^n$ corresponding to the estimated open-circuit voltage $OCV^n$ and the battery temperature $T^n$ is estimated by mapping from the look-up table where SOC for each temperature and each open-circuit voltage is recorded, and the estimated $SOC_{II}^n$ is stored in the memory 104.

If the estimated $SOC_{II}^n$ is stored in the memory 104, the SOC estimation process based on a battery voltage variation pattern is completed.

Experimental Example

Hereinafter, effects of the present invention will be explained based on the following experimental example. However, the following experimental example is just for illustrating the present invention, not intended to limit the scope of the invention.

For this experiment, 12 batteries whose actual capacities are already known were prepared. Among 12 batteries, a sixth battery had a capacity at that time initially produced. After that, while each battery was charged/discharged for a sufficient time under the same charging/discharging conditions, a weighted mean convergence value of SOC variation ratio for each battery was obtained. After that, a correlation between the weighted mean convergence value of SOC variation ratio and the actually known battery capacity was obtained. The correlation was obtained in the form of function using numerical analysis. The function obtained here uses the weighted mean convergence value of SOC variation ratio as an input parameter and the battery capacity as an output parameter.

After the correlation was obtained, while 12 batteries were charged/discharged under the same charging/discharging conditions, a weighted mean convergence value was calculated according to the above Math Figure 5 using a $100^{th}$ measured SOC variation ratio. After that, the weighed mean convergence value was input to the correlation function of each battery to calculate a battery capacity.

FIG. 10 is a table showing actual capacity of each battery, a percentage of present capacity to an initial capacity of each battery, a weighted mean convergence value of SOC variation ratio, a percentage of an estimated capacity to an initial capacity of each battery, and an error of the estimated capacity based on an actual capacity, which are calculated during experiments.

Referring to FIG. 10, the battery capacity estimated according to the present invention exhibited errors within 5% in comparison to actual capacity. Thus, it would be understood that the present invention allows estimation of SOH with high accuracy.

APPLICABILITY TO THE INDUSTRY

According to the present invention, capacity degradation of a battery may be accurately estimated. Also, the accurate estimation of battery capacity degradation may be applied in various ways such as estimation of a battery exchange point. Further, since the capacity degradation of a battery is accurately estimated and the charging/discharging capacity of the battery is controlled according to the capacity degradation, it is possible to prevent overcharging or overdischarging, which further improves safety of the battery.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. An apparatus for estimating SOH (State Of Health) of a battery based on a battery voltage variation pattern, comprising:
   a first SOC (State Of Charge) estimating unit for estimating a first SOC by using a battery current data obtained at time intervals;
   a second SOC estimating unit for estimating an open-circuit voltage from a battery voltage behavior defined by variation patterns of battery voltages obtained at time intervals, and calculating and storing a second SOC corresponding to the estimated open-circuit voltage and the battery temperature using predetermined correlations allowing calculation of SOC from the open-circuit voltage and the battery temperature;
   a weighted mean convergence calculating unit for calculating a convergence value for a weighted mean value of a ratio (or, a SOC variation ratio) between a variation of the first SOC and a variation of the second SOC; and
   a SOH estimating unit for estimating a battery capacity corresponding to the stored weighted mean convergence value by using a predetermined correlation allowing calculation of the battery capacity from the weighted mean convergence value, estimating SOH by using the estimated battery capacity, and storing the estimated SOH.

2. The apparatus for estimating SOH of a battery based on a battery voltage variation pattern according to claim 1,
   wherein the predetermined correlation allowing calculation of the battery capacity from the weighted mean convergence value is a look-up table in which a correlation between the weighted mean convergence value of the SOC variation ratio and the battery capacity is defined after obtaining battery capacities for each weighted mean convergence value of SOC variation ratio by experiments, and
   wherein the SOH estimating unit estimates a battery capacity corresponding to the stored weighted mean convergence value of the SOC variation ratio by mapping from the look-up table.

3. The apparatus for estimating SOH of a battery based on a battery voltage variation pattern according to claim 1, wherein the predetermined correlation allowing calculation of the battery capacity from the weighted mean convergence value is a function calculated by numerical analysis in which the battery capacity is obtained for each of a plurality of weighted mean convergence values of the SOC variation ratio, and the weighed mean convergence value and the battery capacity are used as an input parameter and an output parameter, respectively, and wherein the SOH estimating unit estimates a battery capacity by substituting the stored weighted mean convergence value of the SOC variation ratio as the input parameter of the function.

4. The apparatus for estimating SOH of a battery based on a battery voltage variation pattern according to claim 1,
wherein the SOH estimating unit estimates a relative ratio of the estimated battery capacitor to an initial battery capacity as SOH.

5. The apparatus for estimating SOH of a battery based on a battery voltage variation pattern according to claim 4,
wherein the SOH estimating unit calculates the relative ratio based on an allowable minimal capacity at which the battery is useable, when the relative ratio of a current battery capacity to an initial battery capacity is calculated.

6. The apparatus for estimating SOH of a battery based on a battery voltage variation pattern according to claim 1,
wherein the second SOC estimating unit includes:
an open-circuit voltage variation calculating unit for calculating an open-circuit voltage variation by correcting an error of a battery voltage caused by IR drop from the battery voltage behavior, and estimating an open-circuit voltage variation at a present stage by reflecting a correction factor corresponding to the battery temperature on the calculated open-circuit voltage variation;
an open-circuit voltage calculating unit for estimating a battery open-circuit voltage at a present stage by reflecting the estimated open-circuit voltage variation on a battery open-circuit voltage estimated at a last stage; and
a SOC estimating unit for estimating and storing SOC corresponding to the estimated open-circuit voltage and the measured temperature by using the correlations of the open-circuit voltage and the temperature with SOC.

7. The apparatus for estimating SOH of a battery based on a battery voltage variation pattern according to claim 6,
wherein the open-circuit voltage calculating unit corrects an open-circuit voltage by adding a difference between a weight mean value (a greater weight is endowed as battery voltage is measured earlier) for present and previous battery voltages and an open-circuit voltage at a last stage to the estimated open-circuit voltage at a present stage.

8. The apparatus for estimating SOH of a battery based on a battery voltage variation pattern according to claim 7,
wherein the previous battery voltage is a battery voltage measured at a last stage.

9. The apparatus for estimating SOH of a battery based on a battery voltage variation pattern according to claim 6,
wherein the estimated open-circuit voltage variation is calculated by multiplying the calculated open-circuit voltage variation by the correction factor according to the temperature.

10. The apparatus for estimating SOH of a battery based on a battery voltage variation pattern according to claim 6,
wherein the battery voltages configuring the variation pattern include at least voltages $V_n$, $V_{n-1}$ and $V_{n-2}$ measured at a present stage, at a last stage and at the stage before last.

11. The apparatus for estimating SOH of a battery based on a battery voltage variation pattern according to claim 6,
wherein the open-circuit voltage variation is defined by a mathematical operation of a battery voltage variation between a present stage and a previous stage and a pattern function defined by a relative ratio of a voltage variation of the previous stage based on the voltage variation of the present stage.

12. The apparatus for estimating SOH of a battery based on a battery voltage variation pattern according to claim 6,
wherein the correction factor is calculated by substituting a battery temperature as an input parameter of a mathematical model using the battery temperature (T) as an input parameter and the correction factor of the battery open-circuit voltage variation as an output parameter.

13. The apparatus for estimating SOH of a battery based on a battery voltage variation pattern according to claim 1, further comprising:
a data storing unit for storing battery voltage, current and temperature data obtained at time intervals from a voltage sensing unit, a current sensing unit and a temperature sensing unit, which are coupled to a battery.

14. A system comprising;
a battery;
a load connected with the battery; and
an apparatus for estimating SOH (State Of Health) of the battery based on a battery voltage variation pattern according to claim 1.

15. A method for estimating SOH of a battery based on a battery voltage variation pattern executed by a microcomputer, comprising:
(a) storing in a memory battery voltage, current and temperature data obtained at time intervals from a voltage sensing unit, a current sensing unit and a temperature sensing unit, which are coupled to a battery;
(b) estimating a first SOC by using the stored battery current data;
(c) estimating an open-circuit voltage from a battery voltage behavior defined by variation patterns of battery voltages stored at time intervals, and calculating and storing a second SOC corresponding to the estimated open-circuit voltage and the battery temperature using predetermined correlations allowing calculation of SOC from the open-circuit voltage and the battery temperature;
(d) calculating and storing a convergence value for a weighted mean value of a ratio (or, a SOC variation ratio) between a variation of the first SOC and a variation of the second SOC; and
(e) estimating a battery capacity corresponding to the stored weighted mean convergence value by using a predetermined correlation allowing calculation of the battery capacity from the weighted mean convergence value, estimating SOH by using the estimated battery capacity, and storing the estimated SOH in the memory.

* * * * *